United States Patent
Yi et al.

(10) Patent No.: US 10,365,508 B2
(45) Date of Patent: Jul. 30, 2019

(54) TOUCH CONTROL DISPLAY DEVICE HAVING HIGH RESISTANCE LAYER

(71) Applicant: WGTECH (JIANGXI) CO., LTD., Xinyu (CN)

(72) Inventors: Weihua Yi, Xinyu (CN); Xun Zhang, Xinyu (CN); Huirong Zhou, Xinyu (CN); Bolun Zhang, Xinyu (CN); Junwen Kuang, Xinyu (CN)

(73) Assignee: WGTECH (JIANGXI) CO., LTD., Xinyu (CN)

( * ) Notice: Subject to any disclaimer, the term of this patent is extended or adjusted under 35 U.S.C. 154(b) by 0 days.

(21) Appl. No.: 15/735,603

(22) PCT Filed: Oct. 21, 2016

(86) PCT No.: PCT/CN2016/102792
§ 371 (c)(1),
(2) Date: Dec. 11, 2017

(87) PCT Pub. No.: WO2017/067492
PCT Pub. Date: Apr. 27, 2017

(65) Prior Publication Data
US 2018/0314094 A1    Nov. 1, 2018

(30) Foreign Application Priority Data
Oct. 21, 2015  (CN) .......................... 2015 1 0688739

(51) Int. Cl.
*G06F 3/041*       (2006.01)
*G02F 1/1333*      (2006.01)
(Continued)

(52) U.S. Cl.
CPC ........ *G02F 1/13338* (2013.01); *G06F 3/0412* (2013.01); *H01L 29/1606* (2013.01);
(Continued)

(58) Field of Classification Search
CPC ............ G02F 1/13338; G02F 2202/22; G02F 2203/04103; G02F 2203/04107;
(Continued)

(56) References Cited

U.S. PATENT DOCUMENTS

| 8,692,948 B2 | 4/2014 | Park et al. |
| 2003/0087119 A1* | 5/2003 | Iwabuchi ................ G06F 3/045 |
| | | 428/633 |

(Continued)

FOREIGN PATENT DOCUMENTS

| CN | 102955613 A | 3/2013 |
| CN | 102999223 A | 3/2013 |

(Continued)

OTHER PUBLICATIONS

Japanese Office Action dated Nov. 26, 2018 by JPO for the corresponding Japanese patent application.

(Continued)

*Primary Examiner* — Angela K Davison
(74) *Attorney, Agent, or Firm* — Platinum Intellectual Property LLP

(57) ABSTRACT

A touch control display device having a high resistance layer and a preparation method thereof, the touch control display device (100) having a high resistance layer comprising, stacked sequentially, a thin film transistor substrate (10), a touch control sensing layer (40), a liquid crystal layer (20), a color optical filter substrate (30) and a high resistance layer (50). The material of the high resistance layer (50) is a mixture of graphite oxide and tin oxide.

8 Claims, 3 Drawing Sheets

(51) Int. Cl.
*H01L 51/44* (2006.01)
*H01L 29/16* (2006.01)

(52) U.S. Cl.
CPC ........ *H01L 51/445* (2013.01); *G02F 2202/22* (2013.01); *G06F 2203/04103* (2013.01); *G06F 2203/04107* (2013.01)

(58) Field of Classification Search
CPC ....... G02F 2001/136254; G06F 3/0412; H01L 29/1606; H01L 51/445; H01L 22/12; H01L 22/14; H01L 22/34; C23C 14/35; C23C 14/352; C23C 14/541
See application file for complete search history.

(56) References Cited

U.S. PATENT DOCUMENTS

| | | | | |
|---|---|---|---|---|
| 2011/0285640 | A1* | 11/2011 | Park | G02F 1/13338 345/173 |
| 2013/0299214 | A1* | 11/2013 | Frey | H05K 9/0096 174/253 |
| 2015/0109264 | A1 | 4/2015 | Lettow et al. | |
| 2015/0261254 | A1 | 9/2015 | Hiroki et al. | |

FOREIGN PATENT DOCUMENTS

| | | |
|---|---|---|
| CN | 104063100 A | 9/2014 |
| CN | 104123025 A | 10/2014 |
| CN | 105242431 A | 1/2016 |
| CN | 105242432 A | 1/2016 |
| CN | 105242809 A | 1/2016 |
| JP | 19940234940 A | 8/1994 |
| JP | 2009117597 A | 5/2009 |
| JP | 2012247542 A | 12/2012 |
| TW | 201404245 A | 1/2014 |
| WO | 2013184956 A1 | 12/2013 |
| WO | 2014142121 A1 | 9/2014 |

OTHER PUBLICATIONS

International Search Report dated Jan. 25, 2017 in connection with the corresponding PCT international application.
SIPO Office Action dated Jun. 25, 2018 in connection with the corresponding Chinese patent application.
SIPO Office Action dated Sep. 6, 2017 in connection with the corresponding Chinese patent application.
The 3rd Office Action by CNIPA dated Sep. 20, 2018 for the corresponding Chinese patent application.
EPO Search Report dated Nov. 28, 2018 for the corresponding European patent application.

* cited by examiner

TOUCH CONTROL DISPLAY DEVICE HAVING HIGH RESISTANCE LAYER

RELATED APPLICATIONS

This application is a United States National Stage Application filed under 35 U.S.C 371 of PCT Patent Application Serial No. PCT/CN2016/102792, filed 21 Oct. 2016, which claims Chinese Patent Application Serial No. CN 201510688739.0, filed 21 Oct. 2015, the disclosure of all of which are hereby incorporated by reference in their entirety.

FIELD OF THE INVENTION

The present disclosure relates to the field of display devices, and more particularly relates to a touch display device having a high resistivity layer and a method of manufacturing the same.

BACKGROUND OF THE INVENTION

The touch screen is an important part of the electronic devices such as touch screen mobile phones, tablet computers, e-books, and other electronic devices. Conventional touch screens typically include display modules and touch modules, wherein the touch modules typically include two layers of laminated indium tin oxide (ITO) glasses, which are bonded together by optical adhesive.

However, with the pursuit of thinner and lighter electronic products, the current touch screens include at least two layers of ITO glasses and optical adhesive for bonding, thus the touch screens have thicker thickness, thereby limiting the development of touch screen.

SUMMARY OF THE INVENTION

Accordingly, it is necessary to provide a touch display device having a high resistivity layer with a thinner thickness and a method of manufacturing the same.

A touch display device includes a thin film transistor substrate, a touch sensing layer, a liquid crystal layer, a color filter substrate, and a high resistivity layer, which are sequentially laminated. A material of the high resistivity layer is a mixture of graphite oxide and tin oxide.

A touch display device includes a touch sensing layer, a thin film transistor substrate, a liquid crystal layer, a color filter substrate, and a high resistivity layer, which are sequentially laminated. A material of the high resistivity layer is a mixture of graphite oxide and tin oxide.

A method of manufacturing a touch display device includes:

providing a thin film transistor substrate, forming a touch sensing layer on a surface of the thin film transistor substrate;

providing a color filter substrate, forming a high resistive layer on one surface of the color filter substrate, wherein a material of the high resistivity layer is a mixture of graphite oxide and tin oxide;

combining the thin film transistor substrate and the color filter substrate, forming a liquid crystal layer between the thin film transistor substrate and the color filter substrate, wherein the high resistivity layer is located on a surface of the color filter substrate away from the thin film transistor substrate, the touch sensing layer is sandwiched between the thin film transistor substrate and the liquid crystal layer; and electrically coupling the touch sensing layer and the high resistivity layer, thereby obtaining the touch display device having the high resistivity layer.

The aforementioned touch display device having the high resistivity layer includes the thin film transistor substrate, the touch sensing layer, the color filter substrate, the liquid crystal layer, and the high resistivity layer. The liquid crystal layer is sandwiched between the color filter substrate and the thin film transistor substrate, and the high resistivity layer is located on the surface of the color filter substrate away from the thin film transistor substrate. The high resistivity layer is electrically coupled to the touch sensing layer to form a touch module. Since the high resistivity layer is directly formed on the surface of the color filter substrate, it is not necessary to use a layer of glass to carry the high resistivity layer. Compared to a conventional touch display device having a high resistivity layer, a layer of ITO glass and the optical adhesive for bonding are reduced, such that the aforementioned touch display device having the high resistivity layer is thinner. In addition, the material of the high resistivity layer is the mixture of graphite oxide and tin oxide, which can play a role of static elimination, thereby improving the touch sensitivity.

DETAILED DESCRIPTION OF THE EMBODIMENTS

In order to make the above and other objects, features and advantages of the present invention become more apparent, the specific embodiments will be described in detail in combination with the accompanying drawings. Numerous specific details are described hereinafter in order to facilitate a thorough understanding of the present disclosure. The various embodiments of the disclosure may, however, be embodied in many different forms and should not be construed as limited to the specific embodiments set forth hereinafter, and people skilled in the art can make similar modifications without departing from the spirit of the present disclosure.

Figure 1:
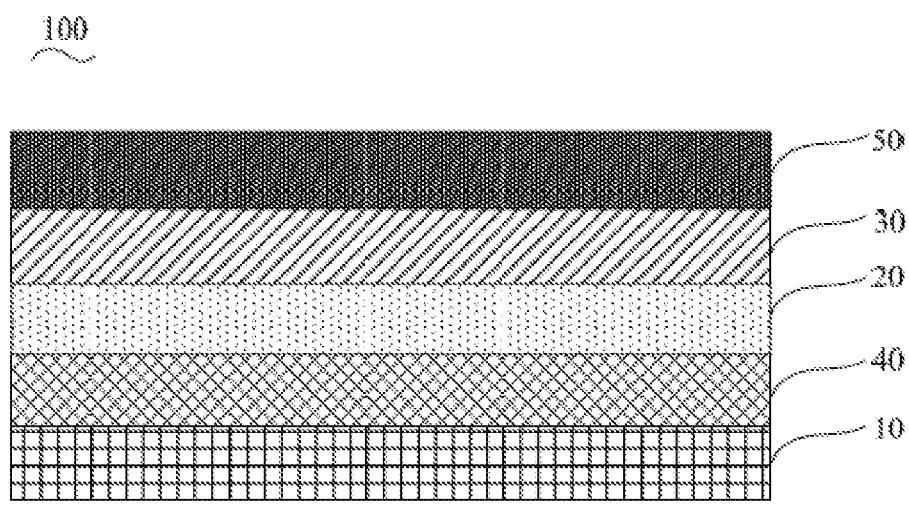
FIG. 1 is a schematic view of a touch display device having a high resistivity layer according to an embodiment.

Referring to FIG. 1, a touch display device 100 according to an embodiment includes a thin film transistor substrate 10, a touch sensing layer 40, a liquid crystal layer 20, a color filter substrate 30, and a high resistivity layer 50, which are sequentially laminated. A material of the high resistivity layer 50 is a mixture of graphite oxide and tin oxide.

The liquid crystal layer 20 is sandwiched between the thin film transistor substrate (TFT) 10 and the color filter substrate 30. The high resistivity layer 50 is located on one surface of the color filter substrate 30 away from the thin film transistor substrate 10. In other words, the liquid crystal layer 20 is formed on a surface of the color filter substrate 30 facing the thin film transistor substrate 10. The touch sensing layer 40 is formed on a surface of the thin film transistor substrate 10. In the illustrated embodiment, the touch sensing layer 40 can be formed on a surface of the thin film transistor substrate 10 facing the color filter substrate

30. In other words, the touch sensing layer 40 is sandwiched between the thin film transistor substrate 10 and the liquid crystal layer 20. The high resistivity layer 50 is formed on one surface of the color filter substrate 30 away from the thin film transistor substrate 10. The touch sensing layer 40 can be embedded in the liquid crystal layer 20, such that the touch panel function is embedded in the liquid crystal pixels. The touch sensor function is embedded inside the display screen, thereby forming an In-Cell type touch display device having the high resistivity layer, which makes the screen more thinner.

In one embodiment, the touch sensing layer 40 and the high resistivity layer 50 are electrically coupled via a lead.

The thin film transistor substrate 10, the color filter substrate 30, and the liquid crystal layer 20 form a display module. The touch sensing layer 40 and the high resistivity layer 50 are electrically coupled to form a touch module.

Figure 2:
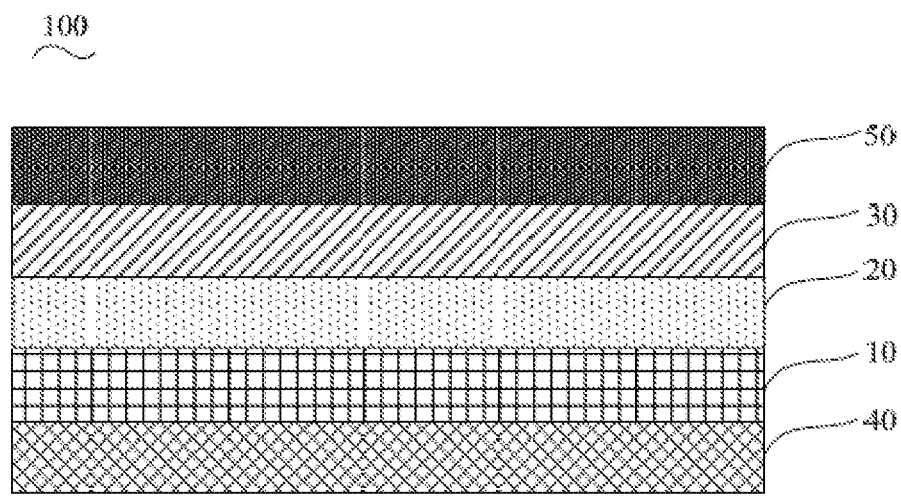
FIG. 2 is a schematic view of a touch display device having a high resistivity layer according to another embodiment.

Referring to FIG. 2, a touch display device 100 according to another embodiment includes a touch sensing layer 40, a thin film transistor substrate 10, a liquid crystal layer 20, a color filter substrate 30, and a high resistivity layer 50, which are sequentially laminated. The touch sensing layer 40 and the high resistivity layer 50 are electrically coupled together, and a material of the high resistivity layer 50 is a mixture of graphite oxide and tin oxide. Specifically, the touch sensing layer 40 and the high resistivity layer 50 are electrically coupled via a lead. In other words, the touch sensing layer 40 can also be formed on a surface of the thin film transistor substrate 10 away from the color filter substrate 30.

Of course, the touch display device 100 having a high resistivity layer further includes other elements such as electrodes, polarizers, cover plates, and the like, and will not be described herein.

In one embodiment, the material of the high resistivity layer 50 is the mixture of graphite oxide and tin oxide.

Graphite oxide (GO) is a new carbon material with excellent adsorption properties. Tin oxide ($SnO_2$) is an active oxide with semiconductor properties. Graphite oxide and tin oxide can be mixed to obtain a composite material with excellent performance. Tin oxide can change the surface properties of graphite oxide. The high porosity and large surface area of graphite oxide can also improve the dispersity of tin oxide. The synergistic effect of the two causes the mixture of graphite oxide and tin oxide to exhibit excellent adsorption and electrical properties.

In one embodiment, the material of the high resistivity layer 50 is a mixture of graphite oxide and tin oxide with a mass ratio of 60:100 to 70:100.

Specifically, in the illustrated embodiment, the mass ratio of graphite oxide and tin oxide is 40.4:59.6.

In general, the less the surface resistance of In-Cell type touch display device, the better the anti-static effect. However, the less the surface resistance is, the easier the In-Cell type touch screen is subjected to interference effect, such that the touch sensitivity is reduced and the touch effect is influenced. The greater the resistance, the less obvious the anti-static effect. The conductivity of the indium tin oxide (ITO) is very strong, when a higher resistance is required to achieve, the thickness of the film layer is too thin, which cannot play the role of anti-static. In the illustrated embodiment, the touch display device has the high resistivity layer 50 made of the mixture of graphite oxide and tin oxide, the high resistivity layer 50 has an effect of adsorbing static, which can eliminate static during manufacturing the touch display device and enhance sensitivity. When the screen is finally formed, the touch sensing layer 40 and the high resistivity layer 50 can be electrically coupled together via electrodes of ITO terminals, which has an excellent antistatic effect and is sensitive to touch.

In one embodiment, the high resistivity layer 50 has a thickness of 12 nm to 25 nm.

In one embodiment, a light transmittance of the high resistivity layer 50 is greater than or equal to 96%. The light transmittance used herein refers to a ratio of a light transmittance of the color filter substrate 30 after forming the high resistivity layer 50 on the color filter substrate 30 and a light transmittance of the color filter substrate 30 before forming the high resistivity layer 50 thereon.

In one embodiment, a chromatic aberration of the high resistivity layer 50 is: L=39.3, a=−1.8, b=−4.8, and ΔE≤0.5.

In one embodiment, the touch sensing layer 40 is made of ITO. Of course, the material of the touch sensing layer 40 is not limited to ITO, but may be other conductive materials such as aluminum-doped zinc oxide (AZO).

The aforementioned touch display device having the high resistivity layer includes the thin film transistor substrate, the touch sensing layer formed on the surface of the thin film transistor substrate, the color filter substrate, the liquid crystal layer, and the high resistivity layer. The liquid crystal layer is sandwiched between the color filter substrate and the thin film transistor substrate, and the high resistivity layer is located on the surface of the color filter substrate away from the thin film transistor substrate. By forming the touch sensing layer on the surface of the thin film transistor substrate and forming the high resistivity layer on the surface of the color filter substrate away from the thin film transistor substrate, the high resistivity layer is electrically coupled to the touch sensing layer to form the touch module. Since the high resistivity layer is directly formed on the surface of the color filter substrate, it is not necessary to use a layer of glass to carry the high resistivity layer. The material of the high resistivity layer is the mixture of graphite oxide and tin oxide, which has excellent adsorption properties, such that an optical adhesive may not be required. Compared to a conventional touch display device having a high resistivity layer, a layer of ITO glass and the optical adhesive for bonding are reduced, such that the aforementioned touch display device having the high resistivity layer is thinner and has better light transmittance. In addition, the mixture of graphite oxide and tin oxide can play a role of static elimination, thereby improving the touch sensitivity.

Figure 3:
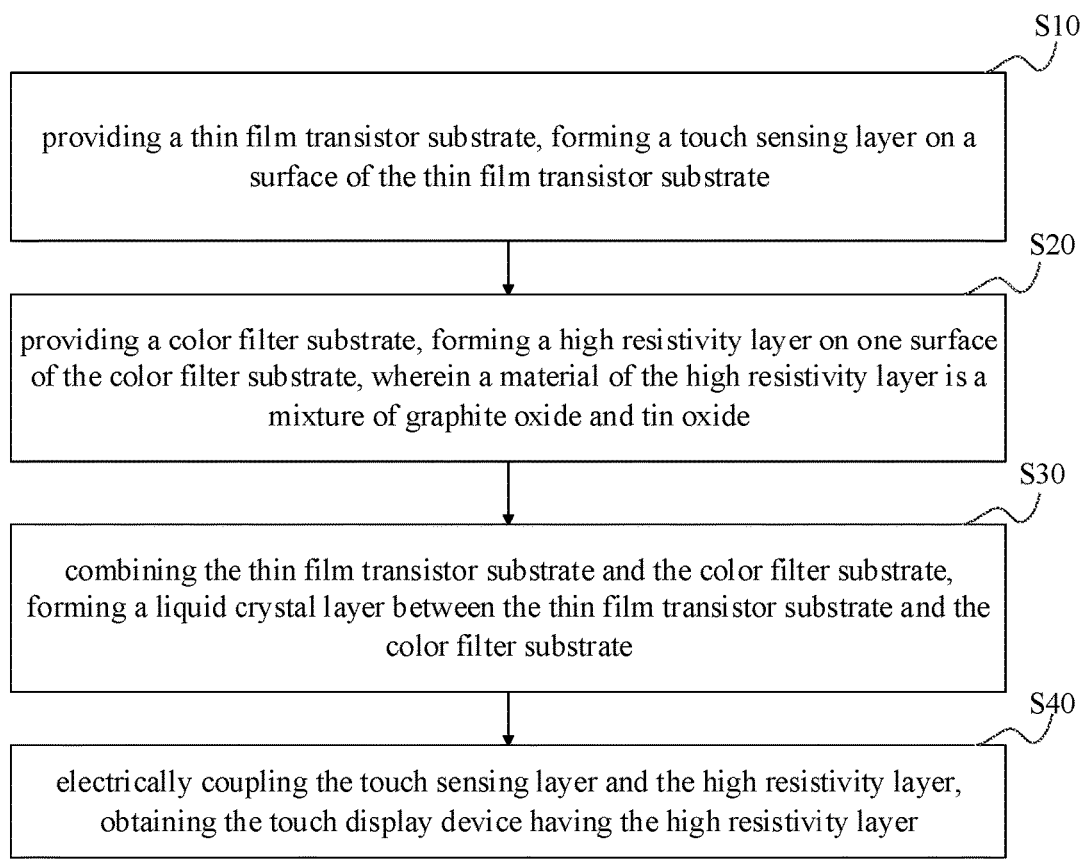
FIG. 3 is a flow chart of a method of manufacturing a touch display device having a high resistivity layer according to an embodiment.

Referring to FIG. 3, a method of manufacturing the touch display device having a high resistivity layer according to an embodiment includes the following steps:

In step S10, a thin film transistor substrate is provided, and a touch sensing layer is formed on a surface of the thin film transistor substrate.

The touch sensing layer 40 is made of ITO. Of course, the material of the touch sensing layer 40 is not limited to ITO, but may be other conductive materials such as AZO.

Specifically, the surface of the thin film transistor substrate can be coated by a screen printing method or a vacuum magnetron sputtering method, and pattern fabrication can be performed by a chemical etching method, thereby obtaining the touch sensing layer.

Specifically, in the illustrated embodiment, the touch sensing layer is formed on the surface of the thin film transistor substrate facing the color filter substrate.

In step S20, a color filter substrate is provided, and a high resistivity layer is formed on one surface of the color filter substrate. A material of the high resistivity layer is a mixture of graphite oxide and tin oxide.

Specifically, a target material can be sputtered onto the surface of the color filter substrate away from the thin film transistor substrate by means of vacuum magnetron sputtering to form the high resistivity layer. The target material is a mixture of graphite oxide and tin oxide.

In one embodiment, the target material is a mixture of graphite oxide and tin oxide with a mass ratio of 60:100 to 70:100.

Specifically, in the illustrated embodiment, the target material is a mixture of graphite oxide and tin oxide with a mass ratio of 40.4:59.6.

The specific process conditions of the vacuum magnetron sputtering are: a coating chamber has a vacuum degree of $2.5\times10^{-1}$ Pa to $3.5\times10^{-2}$ Pa, the color filter substrate has a surface temperature of 80° C. to 100° C., the color filter substrate is heated for 1390 s to 1410 s, a mixed gas has a flow rate of 1265 $sccm^2$ to 1419 $sccm^2$, a voltage is 380 V to 480 V, an anaerobic voltage is 680 V to 760 V, a peroxy voltage is 300 V to 330 V, a power is 6300 W to 7500 W, and a target sputtering distance is 40 mm.

In actual production, the amount of oxygen can be determined by voltage, anaerobic voltage, and peroxy voltage. If the voltage is too high, the target material may be poisoned.

Specifically, the mixed gas is a mixture of oxygen and argon, wherein the oxygen has a flow rate of 35 $sccm^2$ to 39 $sccm^2$, the argon has a flow rate of 1230 $sccm^2$ to 1380 $sccm^2$. Preferably, the purities of oxygen and argon are greater than or equal to 99.999%.

The effect of argon is that: under the action of the electrons and vacuum degree of the coating chamber, the argon becomes argon ions. Argon ions impinge on a surface of the target, and the target atoms are collided and escapes from the surface of the target, wherein the escaped target atoms are also called sputtered atoms. The sputtered atoms are deposited on a surface of the substrate to form a thin film. The effect of oxygen is that: the oxygen oxidizes the surface of the target and particles that have been sputtered, such that a high resistivity layer with a good transmission of light is formed by vacuum magnetron sputtering.

In one embodiment, the color filter substrate is heated to a temperature of 100° C. by using intermediate frequency vacuum magnetron sputtering, a surface temperature difference of the color filter substrate is less than or equal to 1.5° C., and the color filter substrate is heated for 1400 s. The coating chamber has a vacuum degree of $2.5\times10^{-1}$ Pa to $3.5\times10^{-2}$ Pa. An operating speed of the substrate in the coating chamber is 1.0 m/min to 1.5 m/min, and the coating time is 120 s. Using three sets of target spaced sputtering, the oxygen has a flow rate of 35 $sccm^2$ to 39 $sccm^2$, the argon has a flow rate of 1230 $sccm^2$ to 1380 $sccm^2$, a voltage is 465 V, an anaerobic voltage is 725 V, a peroxy voltage is 313 V, a sputtering power is 6300 W to 7500 W, and a target sputtering distance is 40 mm.

Of course, other methods can be used to form the high resistivity layer on the surface of the color filter substrate, such as screen printing.

In one embodiment, prior to forming the high resistive layer on the surface of the color filter substrate away from the thin film transistor substrate, the color filter substrate may be subjected to a cleaning treatment, a drying treatment, and an electrostatic dissipation treatment in sequence. An operation of the cleaning treatment includes performing a pure water cleaning, a lye cleaning, a two-fluid spray cleaning, a ultra-pure water spray cleaning, and a high pressure spray cleaning in sequence. The lye can be a cleaning agent, such as a glass cleaning agent containing potassium hydroxide or sodium hydroxide. The two-fluid spray means that droplets formed by the high pressure gas and the cleaning fluid are sprayed at high speed through the nozzle to clean the surface of the object, after the high pressure gaseous fluid such as air is mixed with the liquid fluid such as water. The pure water in the ultra-pure water spray refers to water which resistivity is greater than or equal to 8 MΩ. The drying treatment includes performing a cold air drying and a hot air drying in sequence. It should be noted that, if the color filter substrate itself is clean without dirt and dust, this step can be omitted.

In step S30, the thin film transistor substrate and the color filter substrate are combined to form a liquid crystal layer, which is located between the thin film transistor substrate and the color filter substrate.

When the thin film transistor substrate is combined with the color filter substrate, in one embodiment, the high resistivity layer is located on the surface of the color filter substrate away from the thin film transistor substrate, and the touch sensing layer is sandwiched between the thin film transistor substrate and the liquid crystal layer. In alternative embodiments, the touch sensing layer is located on the surface of the thin film transistor substrate away from the liquid crystal layer.

The liquid crystal layer can be made of organic matters such as aliphatic, aromatic, stearic acid. The liquid crystal layer can be formed between the thin film transistor substrate and the color filter substrate by a liquid crystal perfusion method. In other words, after the thin film transistor substrate and the color filter substrate are aligned and assembled, the liquid crystal is sucked to form the liquid crystal layer by the capillary principle. Alternatively, using a liquid crystal injection method, the liquid crystal is directly dropped onto the color filter substrate, and then the thin film transistor substrate and the color filter substrate are aligned and assembled.

In step S40, the touch sensing layer is electrically coupled to the high resistivity layer, thereby obtaining the touch display device having the high resistivity layer.

Specifically, the touch sensing layer can be electrically coupled to the high resistivity layer via a lead. The touch sensing layer is electrically coupled to the high resistivity layer to form a touch module. The thin film transistor substrate, the liquid crystal layer, and the color filter substrate form a display module. The touch module and the display module cooperatively form the touch display device having the high resistivity layer.

It should be noted that, an electrical coupling between the touch sensing layer and the high resistivity layer is not necessarily a direct contact between the touch sensing layer and the high resistivity layer, or may also be a coupling between the touch sensing layer and the high resistivity layer via electrode of the ITO terminal when the screen is manufactured.

It should be noted that, the steps of the aforementioned method of manufacturing the touch display device having the high resistivity layer are not limited to the aforementioned sequence, and may be adjusted as necessary.

In the aforementioned method of manufacturing the touch display device having the high resistivity layer, by forming the touch sensing layer on the surface of the thin film transistor substrate and forming the high resistivity layer on the surface of the color filter substrate away from the thin film transistor substrate, the high resistivity layer is electrically coupled to the touch sensing layer to form the touch module. The material of the high resistivity layer is the mixture of graphite oxide and tin oxide, which has excellent adsorption properties, such that an optical adhesive may not be required, and the process steps are relatively simple. The touch display device having the high resistivity layer manufactured by the aforementioned method has a thinner thickness, a better light transmittance, and an anti-static effect, such that the touch sensitivity is high.

The following will be described in detail with reference to specific examples.

In the following examples, the experimental method, which does not specify the specific conditions, unless otherwise specified, is generally in accordance with conventional conditions.

Instrument: vacuum magnetron sputtering coating machine, cleaning machine, high resistance instrument, film thickness gauge, spectrometer, colorimeter, and so on.

Example 1

The high resistivity layer was formed on the surface of the color filter substrate, which includes the following steps of:

(1) The color filter substrate of the touch display device having the high resistivity layer was subjected to a pure water cleaning, a lye cleaning, a two-fluid spray cleaning, a ultra-pure water spray cleaning, and a high pressure spray cleaning in sequence by using the cleaning machine. The dirt and dust on the surface of the substrate were cleaned. The substrate was subjected to a cold air drying, a hot air drying, and an electrostatic dissipation to check the surface without dirt and dust, thereby waiting for the coating.

(2) The vacuum magnetron sputtering coating machine was used to coat, selecting the intermediate frequency sputtering. The substrate was heated to a temperature of 100° C., a surface temperature difference of the substrate was ±1.5° C., and the substrate was heated for 1400 s. An operating speed of the substrate in the coating chamber was 1.2 m/min, and the coating time was 120 s. A flow rate of the oxygen was 38 $sccm^2$, and a flow rate of the argon was 1335 $sccm^2$. A voltage was 465 V, an anaerobic voltage was 725 V, a peroxy voltage was 313 V, a sputtering power was 7200 W, and a target sputtering distance was 40 mm. The sputtering coating was performed in accordance with the following process conditions: a vacuum degree of the coating chamber was between $2.5 \times 10^{-1}$ Pa to $3.50 \times 10^{-2}$ Pa.

A thickness of the high resistivity layer was measured by the film thickness gauge, which was 18 nm.

A chromatic aberration of the high resistivity layer was measured by the colorimeter: L=39.3, a=−1.8, b=−4.8, which was qualified.

A transmittance of the high resistivity layer was measured by the spectrometer, which was 96.8%.

Of course, the manufacturing of the touch display device having the high resistivity layer also includes the manufacturing of a cover plate, a polarizer, and a lead, a conventional method may be employed, and is not limited thereto.

A resistance of the high resistivity layer was measured by a resistance instrument, which was $5 \times 10^8$ $\Omega/cm^2$. A change rate of the resistance of the high resistivity layer was 22% when a baking experiment was carried out at 90° C. and 60% humidity for 240 hours in a temperature humidity chamber. The change rate of the resistance of the high resistivity layer was 24% after 5 minutes of alcohol immersion. The change rate of the resistance was 7% when baked at 60° C. in an oven with pad for 240 hours.

Example 2

The high resistivity layer was formed on the surface of the color filter substrate, which includes the following steps of:

(1) The color filter substrate of the touch display device having the high resistivity layer was subjected to a pure water cleaning, a lye cleaning, a two-fluid spray cleaning, a ultra-pure water spray cleaning, and a high pressure spray cleaning in sequence by using the cleaning machine. The dirt and dust on the surface of the substrate were cleaned. The substrate was subjected to a cold air drying, a hot air drying, and an electrostatic dissipation to check the surface without dirt and dust, thereby waiting for the coating.

(2) The vacuum magnetron sputtering coating machine was used to coat, selecting the intermediate frequency sputtering. The substrate was heated to a temperature of 80° C., a surface temperature difference of the substrate was ±1.5° C., and the substrate was heated for 1390 s. An operating speed of the substrate in the coating chamber was 1.2 m/min, and the coating time was 120 s. A flow rate of the oxygen was 38 $sccm^2$, and a flow rate of the argon was 1335 $sccm^2$. A voltage was 380V, an anaerobic voltage was 680 V, a peroxy voltage was 300 V, a sputtering power was 6300 W, and a target sputtering distance was 40 mm. The sputtering coating was performed in accordance with the following process conditions: a vacuum degree of the coating chamber was between $2.5 \times 10^{-1}$ Pa to $3.50 \times 10^{-2}$ Pa.

A thickness of the high resistivity layer was measured by the film thickness gauge, which was 18 nm.

A chromatic aberration of the high resistivity layer was measured by the colorimeter: L=39.3, a=−1.8, b=−4.8, which was qualified.

A transmittance of the high resistivity layer was measured by the spectrometer, which was 97%.

Of course, the manufacturing of the touch display device having the high resistivity layer also includes the manufacturing of a cover plate, a polarizer, and a lead, a conventional method may be employed, and is not limited thereto.

A resistance of the high resistivity layer was measured by a resistance instrument, which was $5 \times 10^8$ $\Omega/cm^2$. A change rate of the resistance of the high resistivity layer was 21% when a baking experiment was carried out at 90° C. and 60% humidity for 240 hours in a temperature humidity chamber. The change rate of the resistance of the high resistivity layer was 24% after 5 minutes of alcohol immersion. The change rate of the resistance was 8% when baked at 60° C. in an oven with pad for 240 hours.

Example 3

The high resistivity layer was formed on the surface of the color filter substrate, which includes the following steps of:

(1) The color filter substrate of the touch display device having the high resistivity layer was subjected to a pure water cleaning, a lye cleaning, a two-fluid spray cleaning, a ultra-pure water spray cleaning, and a high pressure spray cleaning in sequence by using the cleaning machine. The dirt and dust on the surface of the substrate were cleaned. The substrate was subjected to a cold air drying, a hot air drying, and an electrostatic dissipation to check the surface without dirt and dust, thereby waiting for the coating.

(2) The vacuum magnetron sputtering coating machine was used to coat, selecting the intermediate frequency sputtering. The substrate was heated to a temperature of 100° C., a surface temperature difference of the substrate was ±1.5° C., and the substrate was heated for 1410 s. An operating speed of the substrate in the coating chamber was 1.2 m/min, and the coating time was 120 s. A flow rate of the oxygen was 38 $sccm^2$, and a flow rate of the argon was 1335 $sccm^2$. A voltage was 480 V, an anaerobic voltage was 760V, a peroxy voltage was 330V, a sputtering power was 7500 W, and a target sputtering distance was 40 mm. The sputtering coating was performed in accordance with the following process conditions: a vacuum degree of the coating chamber was between $2.5\times10^{-1}$ Pa to $3.50\times10^{-2}$ Pa.

A thickness of the high resistivity layer was measured by the film thickness gauge, which was 18 nm.

A chromatic aberration of the high resistivity layer was measured by the colorimeter: L=39.3, a=−1.8, b=−4.8, which was qualified.

A transmittance of the high resistivity layer was measured by the spectrometer, which was 96.5%.

Of course, the manufacturing of the touch display device having the high resistivity layer also includes the manufacturing of a cover plate, a polarizer, and a lead, a conventional method may be employed, and is not limited thereto.

A resistance of the high resistivity layer was measured by a resistance instrument, which was $5\times10^8$ Ω/cm². A change rate of the resistance of the high resistivity layer was 19% when a baking experiment was carried out at 90° C. and 60% humidity for 240 hours in a temperature humidity chamber. The change rate of the resistance of the high resistivity layer was 22% after 5 minutes of alcohol immersion. The change rate of the resistance was 9% when baked at 60° C. in an oven with pad for 240 hours.

The foregoing implementations are merely specific embodiments of the present disclosure, but are not intended to limit the protection scope of the present disclosure. It should be noted that any variation or replacement readily figured out by a person skilled in the art within the technical scope disclosed in the present invention shall all fall within the protection scope of the present invention. Therefore, the protection scope of the present invention shall be subject to the protection scope of the appended claims.

What is claimed is:

1. A method of manufacturing a touch display device, comprising:
providing a thin film transistor substrate, forming a touch sensing layer on a surface of the thin film transistor substrate;
providing a color filter substrate, performing a cleaning treatment, a drying treatment, and an electrostatic dissipation treatment to the color filter substrate in sequence; wherein an operation of the cleaning treatment comprises performing a pure water cleaning, a lye cleaning, a two-fluid spray cleaning, a ultra-pure water spray cleaning, and a high pressure spray cleaning in sequence; the drying treatment comprises performing a cold air drying and a hot air drying in sequence, forming a resistivity layer on one surface of the color filter substrate, wherein a material of the resistivity layer is a mixture of graphite oxide and tin oxide;
combining the thin film transistor substrate and the color filter substrate, forming a liquid crystal layer between the thin film transistor substrate and the color filter substrate, wherein the resistivity layer is located on a surface of the color filter substrate away from the thin film transistor substrate, the touch sensing layer is sandwiched between the thin film transistor substrate and the liquid crystal layer; and
electrically coupling the touch sensing layer and the resistivity layer, thereby obtaining the touch display device having the resistivity layer.

2. The method according to claim 1, wherein the operation of forming the resistive layer on one surface of the color filter substrate is: sputtering a target material onto one surface of the color filter substrate by vacuum magnetron sputtering, wherein the target material is a mixture of the graphite oxide and tin oxide, a coating chamber has a vacuum degree of $2.5\times10^{-1}$ Pa to $3.5\times10^{-2}$ Pa, the color filter substrate has a surface temperature of 80° C. to 100° C., the color filter substrate is heated for 1390 s to 1410 s, a mixed gas has a flow rate of 1265 sccm to 1419 sccm, a voltage is 380 V to 480 V, a power is 6300 W to 7500 W, a target sputtering distance is 40 mm.

3. The method according to claim 2, wherein the mixed gas is a mixture of oxygen and argon, the oxygen has a flow rate of 35 sccm to 39 sccm, the argon has a flow rate of 1230 sccm to 1380 sccm.

4. The method according to claim 2, wherein the target material is a mixture of graphite oxide and tin oxide with a mass ratio of 60:100 to 70:100.

5. The method according to claim 4, wherein the target material is a mixture of graphite oxide and tin oxide with a mass ratio of 40.4:59.6.

6. The method according to claim 2, wherein the target material is a mixture of graphite oxide and tin oxide with a mass ratio of 40.4:59.6.

7. The method according to claim 1, wherein the touch sensing layer and the resistivity layer are electrically coupled via a lead.

8. The method according to claim 1, wherein the material of the resistivity layer is a mixture of graphite oxide and tin oxide with a mass ratio of 40.4:59.6.

* * * * *